United States Patent
Hogg et al.

(10) Patent No.: US 9,088,127 B2
(45) Date of Patent: Jul. 21, 2015

(54) METHODS OF MODULATING A QUANTUM DOT LASER AND A MULTISECTION QUANTUM DOT LASER

(75) Inventors: Richard Andrew Hogg, Sheffield (GB); David Timothy Dylan Childs, Sheffield (GB); Benjamin James Stevens, Sheffield (GB); Kristian Michael Groom, Sheffield (GB)

(73) Assignee: Finisar UK Limited, Sedgefield (GB)

( * ) Notice: Subject to any disclaimer, the term of this patent is extended or adjusted under 35 U.S.C. 154(b) by 256 days.

(21) Appl. No.: 12/997,401

(22) PCT Filed: Mar. 30, 2009

(86) PCT No.: PCT/GB2009/000839
§ 371 (c)(1),
(2), (4) Date: Mar. 2, 2011

(87) PCT Pub. No.: WO2009/122157
PCT Pub. Date: Oct. 8, 2009

(65) Prior Publication Data
US 2011/0176564 A1   Jul. 21, 2011

(30) Foreign Application Priority Data
Mar. 31, 2008 (GB) .................. 0805786.1

(51) Int. Cl.
*H01S 3/13* (2006.01)
*H01S 5/0625* (2006.01)
(Continued)

(52) U.S. Cl.
CPC .............. *H01S 5/0625* (2013.01); *B82Y 20/00* (2013.01); *H01S 5/06251* (2013.01); *H01S 5/3412* (2013.01)

(58) Field of Classification Search
CPC . H01S 5/0601; H01S 5/0622; H01S 5/06255; H01S 5/06812; H01S 5/1092; H01S 5/341; H01S 5/3412
USPC ..................... 372/26, 19, 20, 23, 32
See application file for complete search history.

(56) References Cited

U.S. PATENT DOCUMENTS

| 5,200,969 A | 4/1993 | Paoli |
| 5,208,822 A | 5/1993 | Haus et al. |
| 5,379,144 A * | 1/1995 | Shirasaki ............. 398/192 |

(Continued)

FOREIGN PATENT DOCUMENTS

WO    2009019507 A1    2/2009

OTHER PUBLICATIONS

Zhou et al. ("Bias controlled wavelength switching in coupled cavity In0.4Ga0.6As/GaAs self-organized quantum dot lasers", APL, vol. 74, No. 6, pp. 783-785).*

(Continued)

*Primary Examiner* — Tod T Van Roy
(74) *Attorney, Agent, or Firm* — Quinn Law Group, PLLC.

(57) ABSTRACT

A multisection quantum dot laser (7) comprising at least first (8) and second (9) sections, each section (8, 9) comprising a semiconductor substrate (2) comprising p (3) and n type (4) layers and a quantum dot layer sandwiched therebetween; the semiconductor substrate (2) comprising a back electrical contact in electrical contact with one of the p and n type layers and a tuning electrical contact (13, 14) in electrical contact with the other of the p and n type layers; the quantum-dot layers of the first (10) and second (11) sections being portions of the same quantum dot layer (12) forming a laser cavity.

3 Claims, 6 Drawing Sheets

(51) Int. Cl.
 *B82Y 20/00* (2011.01)
 *H01S 5/34* (2006.01)

(56) References Cited

U.S. PATENT DOCUMENTS 6,052,400 A * 4/2000 Nanbu et al. .................. 372/50.1
7,103,079 B2 9/2006 McInerney et al.

2005/0271089 A1 12/2005 Robbins et al.
2008/0310470 A1 12/2008 Ooi et al.

OTHER PUBLICATIONS

Stevens et al. ("All semiconductor swept laser source utilizing quantum dots", APL, 91, 121119, 2007).*
Markus et al. ("Two-state switching and dynamics in quantum dot two-section lasers", J. of Applied Physics, 100, 113104, 2006).*

* cited by examiner

METHODS OF MODULATING A QUANTUM DOT LASER AND A MULTISECTION QUANTUM DOT LASER

The present invention relates to methods of modulating a quantum dot laser. The present invention also relates to a multisection quantum dot laser and methods of modulating such a laser. More particularly, but not exclusively, the present invention relates to a method of modulating a multisection quantum dot laser by tuning the cavity gain of the laser.

Quantum dot lasers are known. It is also known to modulate such lasers. This is typically achieved by applying a DC tuning current to the laser such that the laser lases. An ac modulation is then superimposed on the tuning current. The output power increases as the tuning current increases and vice versa. However, the drawback of this is that a higher tuning current also results in a lower refractive index of the laser cavity which in turn means a blueshift of lasing wavelength. This can be detrimental if it is of the same sign as the transmission media for the laser signal (ie the optical fibre) since the data bit will spread out over time.

The present invention seeks to overcome the drawbacks of the modulation scheme of the prior art.

Accordingly, in a first aspect, the present invention provides multisection quantum dot laser comprising at least first and second sections, each section comprising
  a semiconductor substrate comprising p and n type layers and a quantum dot layer sandwiched therebetween;
  the semiconductor substrate comprising a back electrical contact in electrical contact with one of the p and n type layers and a tuning electrical contact in electrical contact with the other of the p and n type layers;
  the quantum dot layers of the first and second sections being portions of the same quantum dot layer forming a laser cavity.

The multisection quantum laser can be used in a plurality of modulation schemes which overcome the drawbacks of the prior art.

Preferably, the back electrical contacts of the first and section sections are portions of a single back electrical contact.

Preferably, each tuning electrical contact and back electrical contact pair is each connected to a current source such that both sections are forward biased.

At least one current source can be a variable current source.

In a further aspect of the invention there is provided a method of modulation of a multisection quantum dot laser comprising the steps of
  providing a multisection quantum dot laser as claimed in claim 1;
  providing currents to the first and second tuning electrical contacts such that the first section lases in at least one mode and the second section is forward biased; and
  varying the current to the second tuning electrical contact to vary the cavity gain of the laser cavity so as to switch the at least one mode between on and off states, so modulating the laser.

Preferably, the current to the first tuning electrical contact causes the first section to lase in a plurality of modes and the step of varying the current to the second tuning electrical contact switches at least one mode between on and off states.

Preferably, the method comprises the step of repeatedly varying the current to the second tuning electrode to switch the at least one mode between on and off states.

The method can further comprise the step of providing the output of the laser to an optical fibre.

In a further aspect of the invention there is provided a method of modulating a quantum dot laser, the quantum dot laser having a cavity gain such that the laser lases in a first mode when the tuning current is in an active range between first and second current values but does not lase when the tuning current is in an inactive range outside these values, the method comprising the steps of
  providing the quantum dot laser;
  varying the tuning current between inactive and active ranges so modulating the laser.

Preferably, the step of varying the tuning current comprises varying the current from a first portion of the inactive region, through the active region to a second portion of the inactive region on the opposite side of the active region to the first portion, so producing duobinary modulation.

Preferably, the step of providing the quantum dot laser comprises providing a multisection quantum dot laser and the step of varying the tuning current comprises varying the tuning current to the first tuning electrical contact,
  the method further comprising the step of providing a current to the second tuning electrical contact to tune the cavity gain such that the laser exhibits the active and inactive regions.

In a further aspect of the invention there is provided a method of modulating a quantum dot laser, the laser having a cavity gain such that when the tuning current is in a first range the laser lases in a first mode and when the tuning current is in a second range the laser lases in a second mode, the method comprising the steps of
  providing a quantum dot laser; and,
  modulating the tuning current in and out of the second range, turning the second mode on and off, so modulating the laser.

The first and second ranges can overlap.

Alternatively, the first and second ranges do not overlap.

Preferably, the step of providing the laser comprises providing a multisection quantum dot and the step of modulating the tuning current comprises modulating the current to the first tuning electrical contact;
the method further comprising the step of setting the current to the second tuning electrical contact to tune the cavity gain such that the laser exhibits the first and second ranges.

In a further aspect of the invention there is provided a method of modulation of a quantum dot laser comprising the steps of
  providing a quantum dot laser adapted to lase in at least a first mode; and,
  oscillating the tuning current to the laser to modulate the laser, at least a portion of the oscillation of the tuning current being within a negative chirp range in which the laser output intensity from the laser mode decreases with increasing current.

The step of providing a quantum dot laser comprises the step of providing a multisection quantum dot and the step of oscillating the tuning current comprises oscillating the current to the first tuning electrical contact,
  the method further comprising the step of setting the current to the second tuning electrical contact to tune the cavity gain such that the laser exhibits the desired negative chirp range.

Preferably, the method further comprises the step of providing the output of the laser to a dispersive optical fibre.

The present invention will now be described by way of example only and not in any limitative sense with reference to the accompanying drawings in which FIG. 1 shows, in schematic form, a quantum dot laser;

FIGS. 2(a) and 2(b) show in schematic form the energy levels of a quantum dot;

Figure 5:
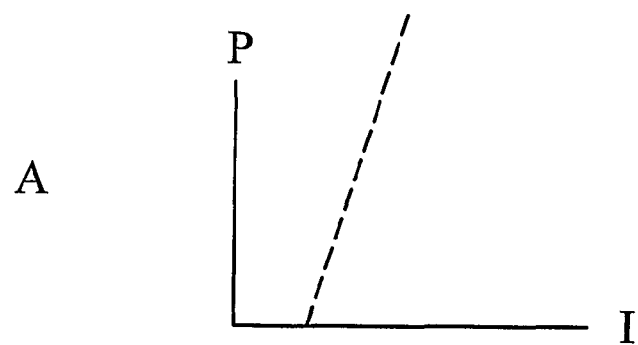
Figure 5:
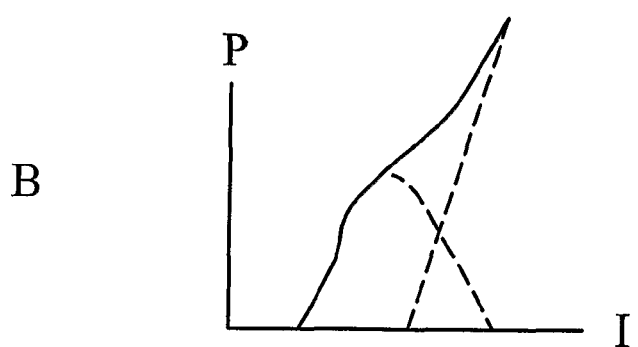
Figure 5:
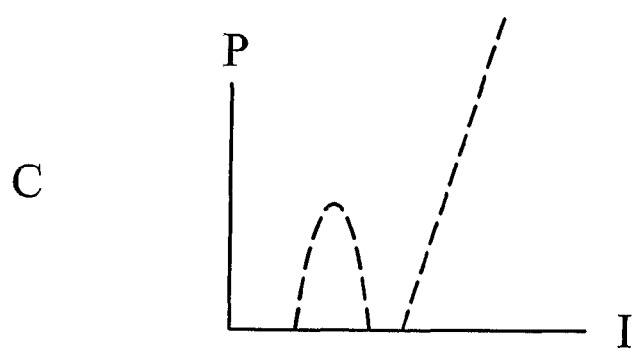
Figure 5:
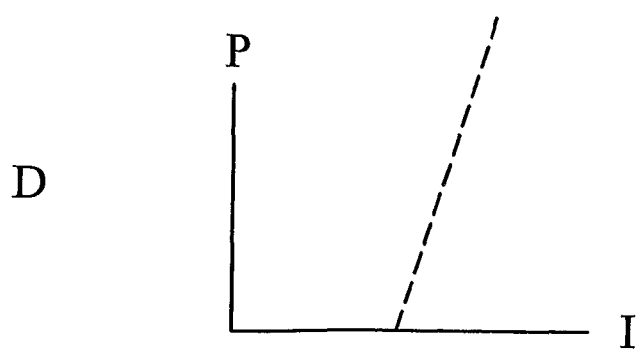
Figure 6:
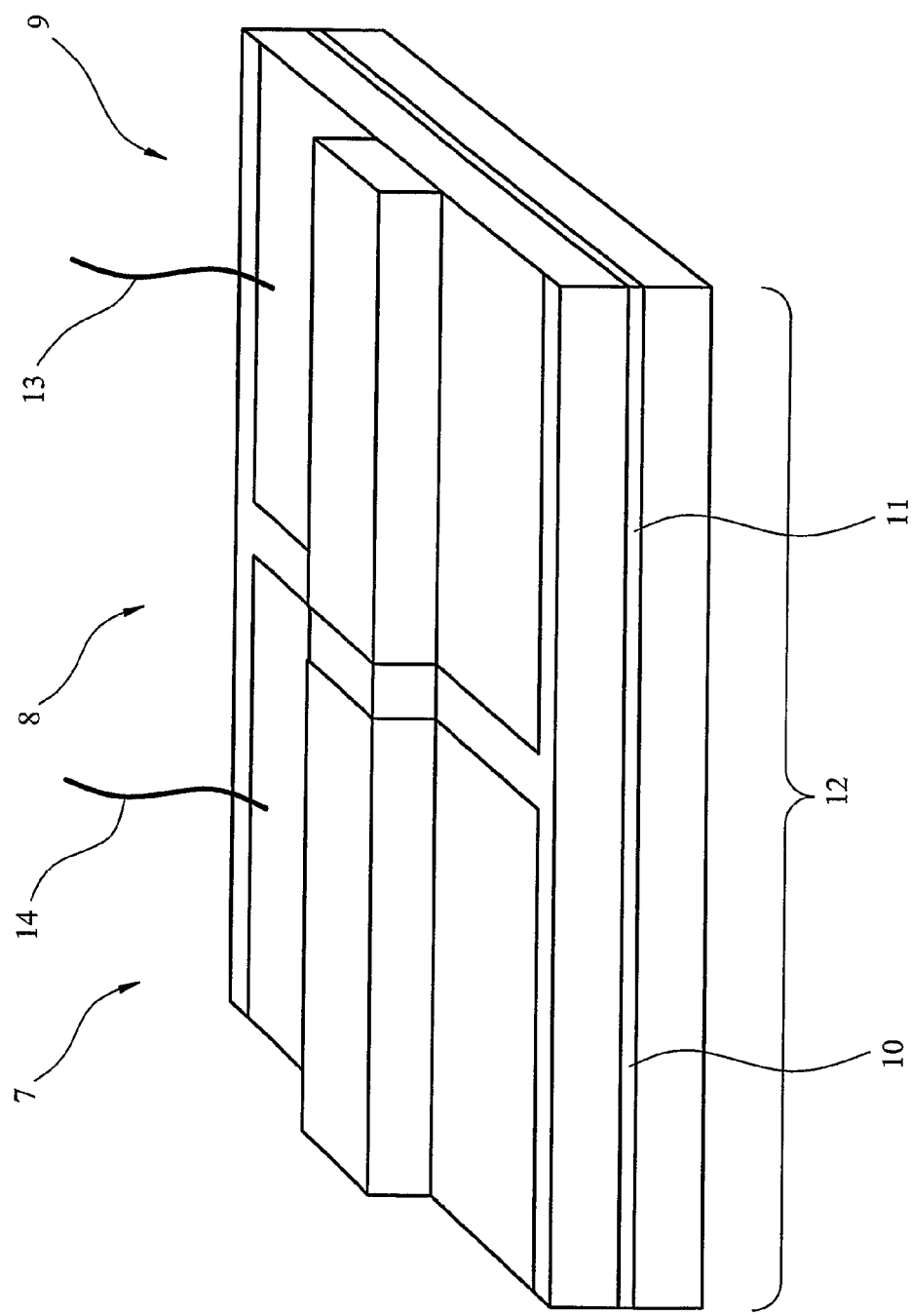

FIGS. 5(a) to 5(d) show the output intensity of a qd laser as a function of current for different cavity losses; and, FIG. 6 shows a multisection qd laser according to the invention.

Figure 1:
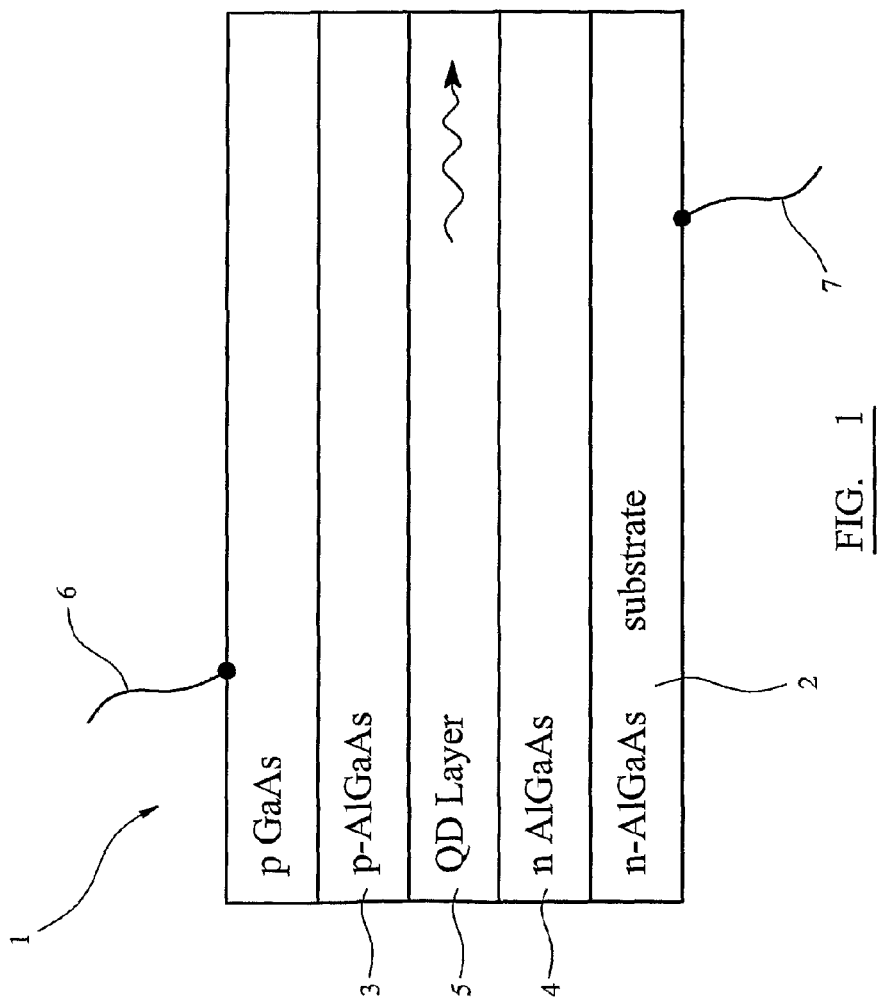

Shown in FIG. 1 in schematic form is a cross section through a quantum dot (qd) laser 1. The qd laser 1 comprises a substrate 2. On the substrate 2 are p and n doped AlGaAs semiconductor layers 3,4. Sandwiched between the p and n layers is a quantum dot layer 5. The p and n layers 3,4 together form a pn junction. The qd laser 1 has a tuning contact 6 and a back contact 7 connected to the p and n type layers respectively for varying a tuning current supplied to the laser 1.

The operation of qd lasers 1 is known and will only briefly be summarised. When the pn junction is reversed biased there are no electrons or holes within the depletion layer. The device therefore does not act as a laser 1. When the pn junction is forward biased however electrons and holes travel towards the quantum dot layer where they fall into the energy levels of the quantum dots.

Figure 2A:
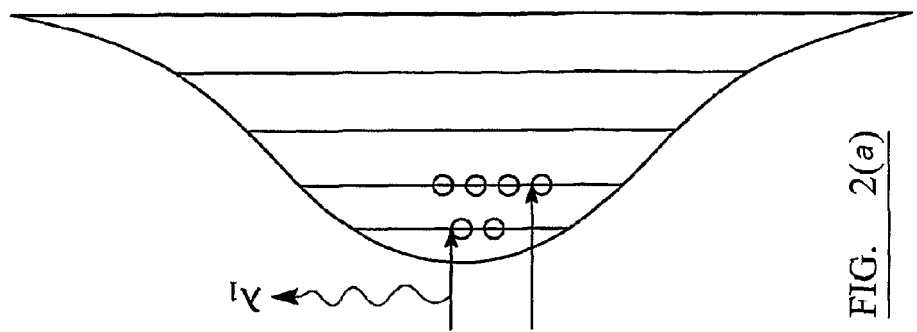
Figure 2A:
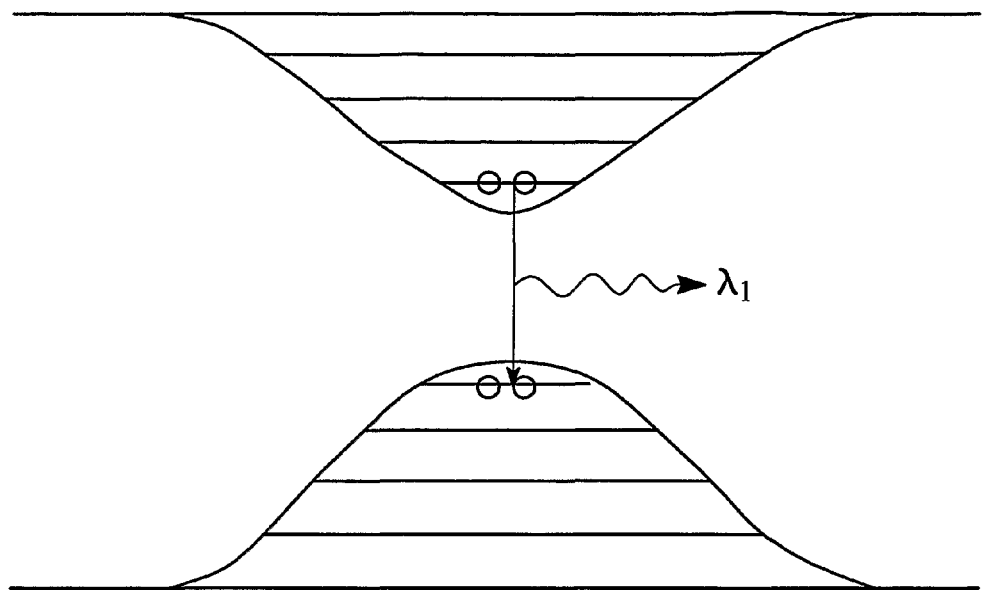
Figure 2B:
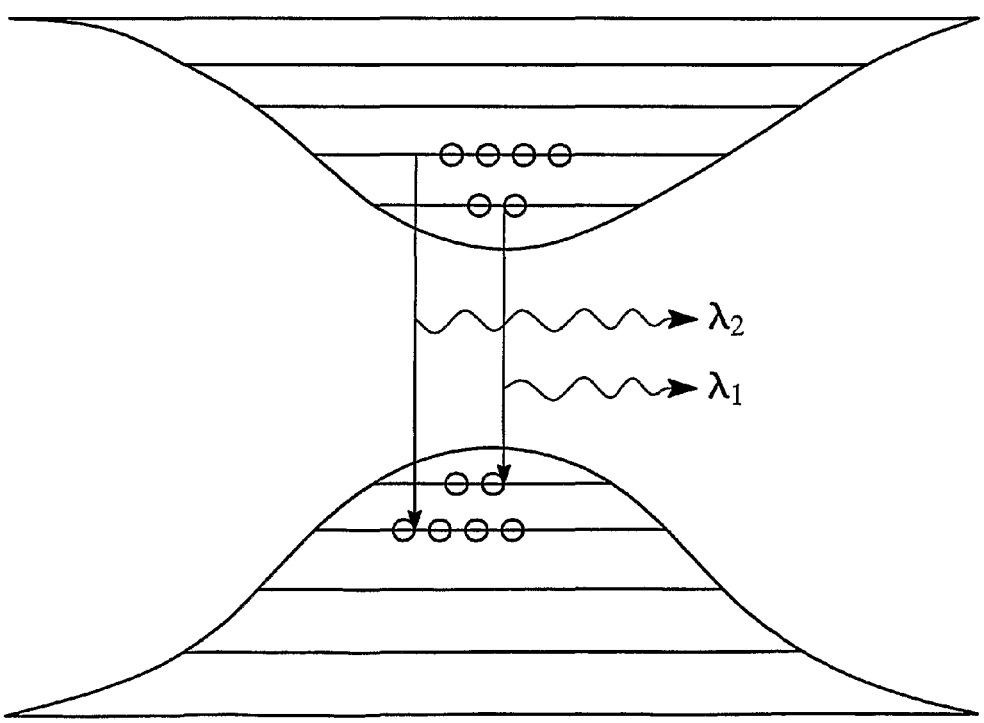

FIGS. 2(a) and 2(b) show the energy levels of the quantum dots in schematic form. At low tuning currents the electrons and holes fall into the lowest energy levels of the dots. They then combine producing a photon at wavelength lambda 1. At higher tuning currents the electrons and holes saturate the ground states and pile up into the next excited levels. The electrons and holes in the excited states combine emitting a photon at a different wavelength lambda 2.

The emitted photons travel within the quantum dot layer 5 which forms part of a laser cavity. An important property of the cavity is the cavity gain. The cavity gain comprises two components, a loss component and a gain component. The loss component is related to the properties of the cavity such as the mirror loss at the end of the end of the cavity and the scattering from materials within the cavity. The gain component relates to the properties of the quantum dot layer 5.

Figure 3:
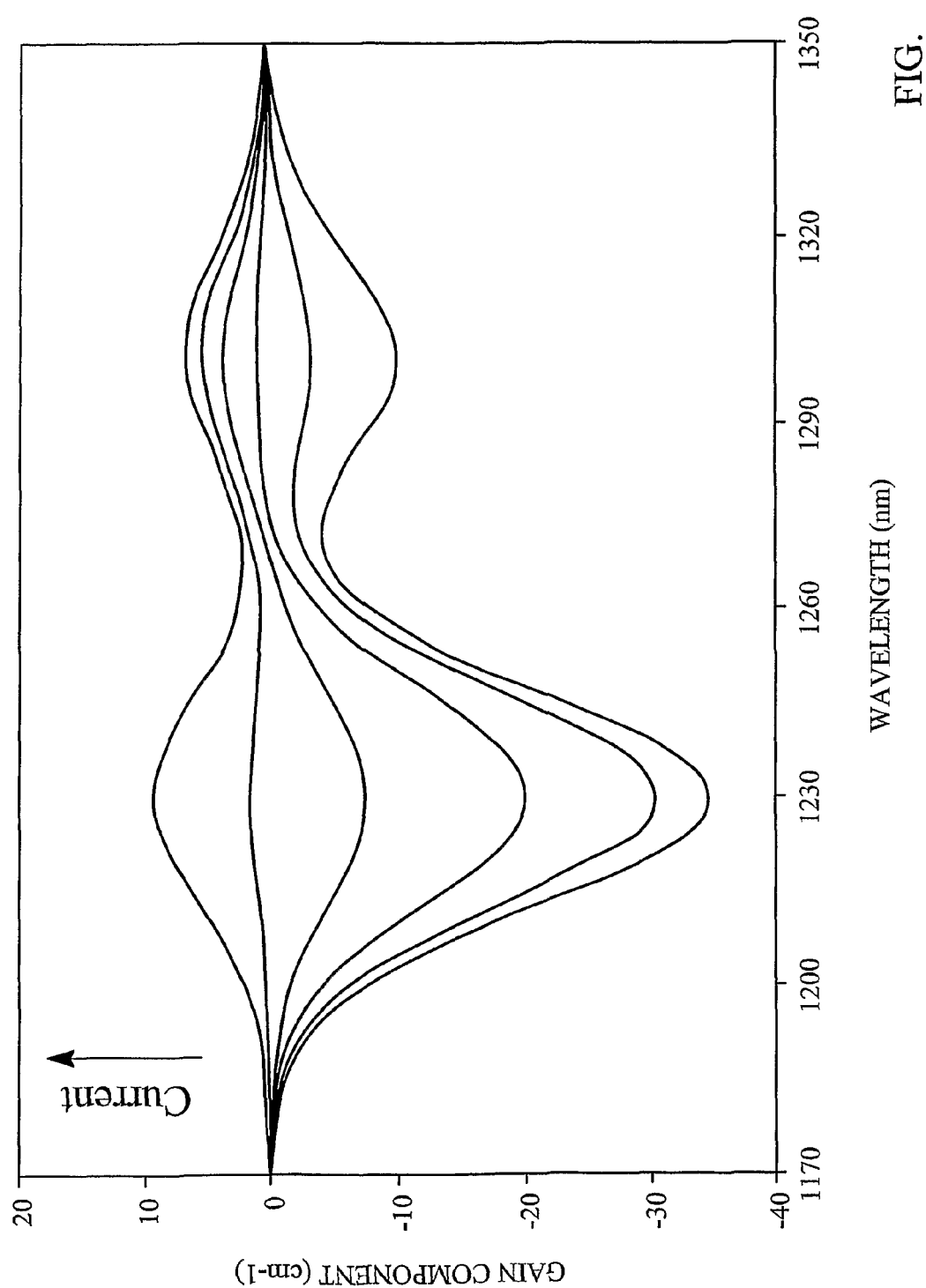
FIG. 3 shows the gain component of a qd laser as a function of wavelength and current.

FIG. 3 shows the gain component for a quantum dot layer 5 as a function of wavelength and tuning current to the pn junction. The quantum dots have energy levels which result in the emission of photons at lambda 1 and lambda 2. At very low current the majority of the quantum dots have empty or partially filled ground states. A photon of wavelength lambda 1 travelling through the quantum dot layer is rapidly absorbed by other quantum dots. The gain component is therefore negative and such photons are rapidly attenuated. As the current is increased the ground states of the dots fill As a photon of wavelength lambda 1 passes though the quantum dot layer 5 it stimulates the emission of further photons at lambda 1 and so the gain component is positive. At still higher currents the electrons and holes pile up in the excited levels and again the gain component becomes positive at the wavelength corresponding to the transition from the excited levels.

Figure 4:
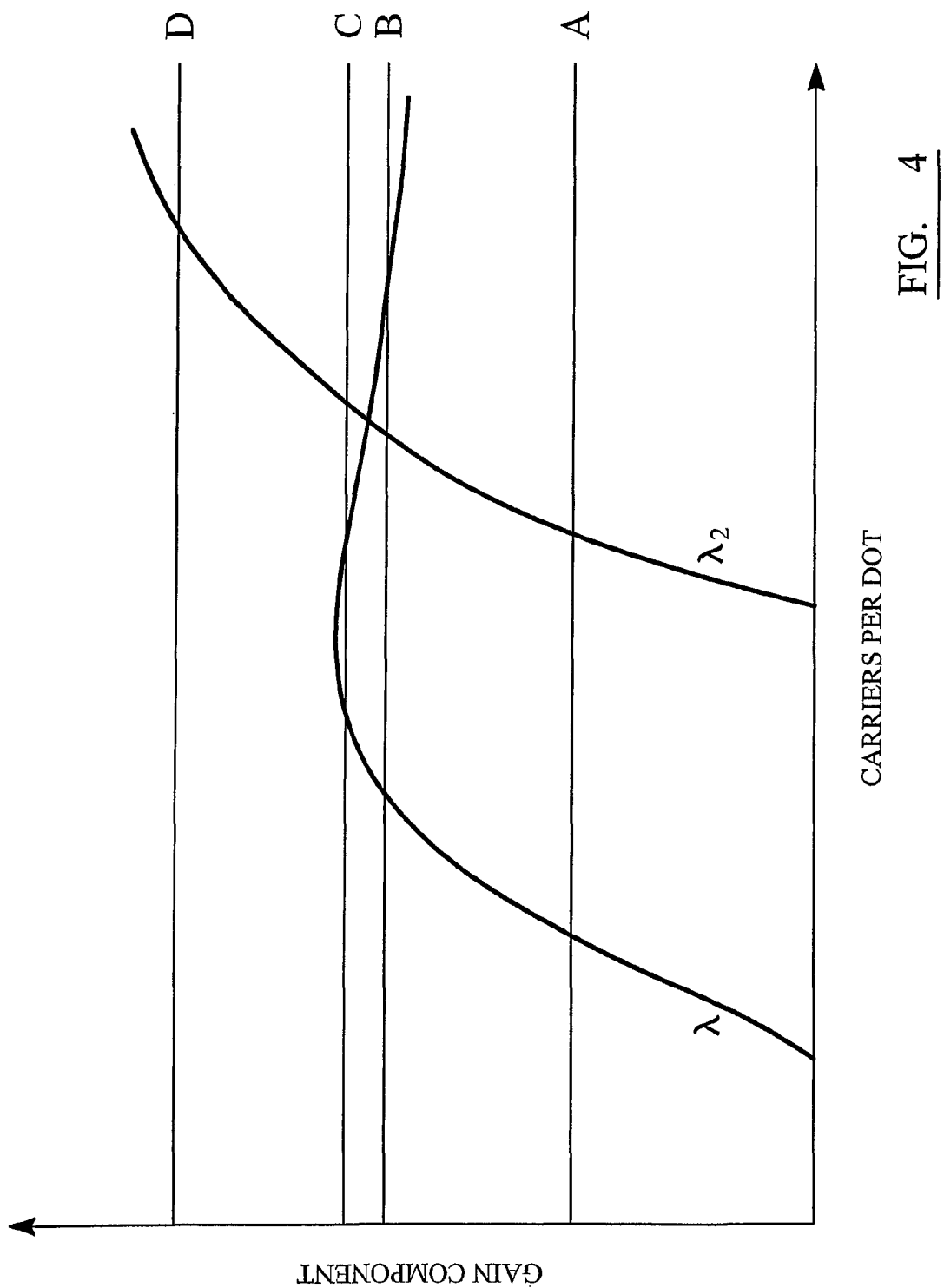
FIG. 4 shows the gain component of a qd laser as a function of number of carriers per dot.

FIG. 4 shows the gain component at lambda 1 and lambda 2 as a function of number of carriers per quantum dot (related to the tuning current provided to the pn junction). As can be seen the gain component of the cavity gain initially increases at lambda 1 with increasing current. The gain component however reaches a peak and then decreases with increasing current. This is may be due to increased homogeneous line width (due to carrier scattering) and/or the free carrier plasma effect.

The behaviour of the device depends upon the relation between the gain and loss components of the cavity gain. If the gain component is smaller than the loss component at lasing wavelengths lambda1 and lambda 2 the device acts as a diode rather than a laser. Once the gain component exceeds the loss component the device acts as a laser.

Line A in FIG. 4 shows a qd laser 1 with low loss component. As current to the laser 1 is increased the gain component at lambda 1 relating to the combination of electrons and holes in the quantum dot ground state (the first laser mode) begins to increase. Once this exceeds the loss component at this wavelength the laser 1 begins to lase with the laser output varying linearly with current. This is shown in FIG. 5(a). Known modulation schemes rely on this variation of laser output with current.

Line B in FIG. 4 shows a qd laser 1 with a higher loss component. As current increases the laser 1 lases in a first mode at lambda 1 as before. As current is further increased the laser 1 begins to lase in a second laser mode at lambda 2 when the gain component exceeds the loss component at this wavelength. As the current is further increased the gain component at lambda 1 corresponding to the first laser mode drops below the loss component and the laser stops lasing in the first mode. This is shown in detail in FIG. 5(b).

Line C in FIG. 4 shows a qd laser 1 with a higher loss component. As current is increased the first mode briefly turns on and off. As the current is further increased the second mode switches on. This is shown in FIG. 5(c).

Line D in FIG. 4 shows a qd laser 1 with still higher loss component. As current is increased the laser never lases in the first mode. Eventually the laser lases in the second mode. This is shown in FIG. 5(d).

Such behaviour of qd lasers 1 enables a variety of novel modulation schemes according to the invention, depending upon the relation between the gain and loss component of the laser 1.

In a first method a quantum dot laser is chosen with a loss component close to B or C. A DC tuning current is provided close to where the laser begins to lase in the second mode. The tuning current is then oscillated about the DC value to turn the second mode on or off. If the loss component is close to B the first mode does not turn off until after the second mode is turned on. With such a modulation scheme filters can be used to separate the output from the laser into the output from the different modes. If the loss component is close to C the first mode switches off before the second mode switches on. Quantum dot lasers having loss components closer to C are to be preferred. Such a modulation scheme will work even with the loss component far away from B or C, for example close to A When the second mode switches on however the first mode is significantly stronger than the second. Ideally, one requires a loss component adjusted such that the first mode switches off just as the second mode switches on.

In a second method a quantum dot laser 1 is provided with a loss component close to C. For a portion of the tuning current range the laser exhibits negative chirp with laser output decreasing as tuning current increases. According to the method a DC tuning current is set within the negative chirp region. The tuning current is then modulated about the DC value at least partly (preferably entirely) within the negative chirp region. This has a particular advantage when the output of the laser 1 is connected to an optical fibre having positive dispersion. With pulses generated according to the known method the data bit will spread out over distance. This effect is reduced with the method according to the invention.

In a further method according to the invention a qd laser 1 is again chosen with a loss component close to C. The laser 1 lases in a first mode when the tuning current is in an active region and does not modulate when the tuning current is in an inactive region having sub regions on each side of the active region. The tuning current is modulated to pass from one sub region to the other through the active region turning the laser on and off. This produces duobinary modulation. Know methods of modulation of qd lasers require a Mach Zehnder modulator after the laser to produce this coding scheme.

The above modulation schemes according to the invention depend greatly upon the loss component. The loss component depends critically upon the properties of the laser cavity and can vary greatly between devices. Quantum dot lasers 1 made by the same production route can have different loss components. It is therefore not economically viable to manufacture quantum dot lasers 1 for use in such encoding schemes as only a small proportion of the quantum dot lasers 1 will have loss components within the desired ranges.

Shown in FIG. 6 is a multisection quantum dot laser 7 according to the invention. The multisection quantum dot laser 7 comprises two sections 8,9, each section 8,9 being a quantum dot laser 1. The two quantum dot layers 10,11 of the two sections 8,9 are portions of a single quantum dot layer 12 so forming a single laser cavity. In this embodiment the two back contacts are connected together but this need not be the case in other embodiments.

In use both sections 8,9 of the quantum dot laser 7 are forward biased. The first section 8 acts as a quantum dot laser 7 as described above. By providing a tuning current to the tuning contact 13 of the second section 9 (the second tuning contact) one can change the gain component of the laser cavity. As the light from the first section 8 travels through the laser cavity it passes through the second section 9 of the quantum dot laser 7. By varying the tuning current to the second tuning contact 13 one can vary the population of the levels of the quantum dots in this region. This determines the degree by which this light is amplified. Returning to FIG. 4, the effect of varying the current to the second tuning contact 13 is to shift the gain component curves up or down as desired relative to the loss component. In order to perform a method of modulation according to the invention as described above, one first sets the current to the second tuning contact 13 such that the gain components are shifted to lie in the correct position relative to the loss component for the desired modulation scheme. One can then modulate the quantum dot laser by varying the tuning current to the tuning contact 14 of the first section 8 (the first tuning contact). Another way of expressing this is that by varying the current to the second tuning contact 13 one is tuning the cavity gain of the laser 7 such that the laser 7 exhibits the desired properties.

Use of such a multisection quantum dot laser 7 enables a further modulation scheme according to the invention. In a first step currents are supplied to both the first and second tuning contacts 14,13 such that both sections 8,9 are forward biased and the first section 8 lases in at least one mode. The tuning current to the second tuning contact 13 is then varied. This varies the gain component of the cavity. If the gain component is exceeded by the loss component the laser 7 will no longer lase in the first mode. Accordingly, by varying the tuning current to the second tuning contact 13 one can switch the first section 8 between lasing and nonlasing states, so modulating the laser 7.

Lasers having more than two sections are also possible. Each of the sections can be used to independently vary the gain component of the laser cavity.

The above embodiments of the quantum dot laser according to the invention all comprise a quantum dot layer between single n and p type semiconductor layers. In alternative embodiments of the invention the laser comprises further layers. For example the laser may comprise superlattice layers between the quantum dot layer and the p and n layers.

All of the above embodiments have been described with the tuning contact(s) connected to the p type layer. In alternative embodiments the tuning contacts are connected to the n type layer.

Finally, all of the above embodiments have been described with reference to varying the tuning current to a tuning contact. Varying the current to the tuning contact varies the current to the corresponding back contact and the invention could equally be described with reference to varying the current to a back contact.

The invention claimed is:

1. A method of modulating a quantum dot laser comprising the steps of:
   providing a quantum dot laser having a tuning contact connected thereto, the quantum dot laser having a cavity gain that increases, reaches a peak, and subsequently decreases, in response to increasing a tuning current, such that the laser lases in a first mode when the tuning current provided by the tuning contact is in an active range between first and second current values and the laser does not lase at all when the tuning current provided by the tuning contact is in an inactive range outside these values; and
   varying the tuning current from a first portion of the inactive range, through the active range to a second portion of the inactive range on the opposite side of the active range to the first portion, so producing duobinary modulation.

2. A method of modulation of a quantum dot laser comprising the steps of
   (i) providing a quantum dot laser having a tuning contact connected thereto, the quantum dot laser having a cavity gain that increases, reaches a peak, and subsequently decreases, in response to increasing a tuning current, such that the laser lases in a first mode when the tuning current provided by the tuning contact is in an active range between first and second current values, the laser lasing in the first mode over the entire active range; and
   (ii) oscillating the tuning current to the laser in the active range to modulate the laser, at least a portion of the oscillation of the tuning current being within a negative chirp range in which the laser output intensity from the laser mode decreases with increasing current and lasing ceases.

3. A method as claimed in claim 2, further comprising the step of providing the output of the laser to a dispersive optical fiber.

* * * * *